(12) United States Patent
Hatano et al.

(10) Patent No.: US 11,602,856 B2
(45) Date of Patent: Mar. 14, 2023

(54) VACUUM TRANSFER DEVICE AND SUBSTRATE PROCESSING SYSTEM

(71) Applicant: Tokyo Electron Limited, Tokyo (JP)

(72) Inventors: Tatsuo Hatano, Yamanashi (JP); Naoki Watanabe, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/371,901

(22) Filed: Jul. 9, 2021

(65) Prior Publication Data

US 2022/0016786 A1 Jan. 20, 2022

(30) Foreign Application Priority Data

Jul. 14, 2020 (JP) .............................. JP2020-120638

(51) Int. Cl.
*H01L 21/67* (2006.01)
*B25J 11/00* (2006.01)
*B25J 21/00* (2006.01)
*B25J 19/00* (2006.01)
*B25J 17/02* (2006.01)
*H01L 21/677* (2006.01)

(52) U.S. Cl.
CPC ....... *B25J 11/0095* (2013.01); *B25J 19/0054* (2013.01); *B25J 21/00* (2013.01); *H01L 21/67167* (2013.01); *B25J 17/025* (2013.01); *H01L 21/67742* (2013.01)

(58) Field of Classification Search
CPC ............... B25J 19/0054; H01L 21/677; H01L 21/67742
See application file for complete search history.

(56) References Cited

U.S. PATENT DOCUMENTS

| 6,298,684 B1 * | 10/2001 | Mitsuyoshi | H01L 21/67109 62/337 |
| 8,203,101 B2 * | 6/2012 | Miyamoto | B65G 49/067 219/439 |
| 10,155,309 B1 * | 12/2018 | Blank | H01L 21/67259 |

FOREIGN PATENT DOCUMENTS

| JP | 2001-035902 A | 2/2001 |
| KR | 2003-0004495 | * 1/2003 |

* cited by examiner

*Primary Examiner* — William C Joyce
(74) *Attorney, Agent, or Firm* — Venjuris, P.C.

(57) ABSTRACT

A vacuum transfer device includes: a main body including an arm unit with an internal mechanical part therein and a vacuum seal, and configured to transfer a high temperature substrate in a vacuum; a substrate holder connected to the main body to hold the substrate; a heat transport member provided on a surface of the main body and made of a material having a higher thermal conductivity than that of a material constituting the main body in a creeping direction to transport heat transferred from the substrate to the substrate holder; and a heat radiator configured to dissipate heat transported by the heat transport member.

16 Claims, 3 Drawing Sheets

VACUUM TRANSFER DEVICE AND SUBSTRATE PROCESSING SYSTEM

CROSS-REFERENCE TO RELATED APPLICATIONS

This application is based on and claims priority from Japanese Patent Application No. 2020-120638, filed on Jul. 14, 2020 with the Japan Patent Office, the disclosure of which is incorporated herein in its entirety by reference.

TECHNICAL FIELD

The present disclosure relates to a vacuum transfer device and a substrate processing system.

BACKGROUND

In a semiconductor manufacturing process, a film forming processing such as CVD, ALD, or PVD is performed. A film forming system that performs a film forming processing transfers a semiconductor wafer (wafer) which is a substrate by a vacuum transfer device to a processing apparatus that performs a film forming processing such as CVD on the wafer in a vacuum. The film forming processing is performed at a high temperature in many cases, and when the wafer is taken out from the processing apparatus by the substrate holder, the temperature of a substrate holder of the vacuum transfer device ranges from 200° C. to 400° C., and in recent years, the temperature is even higher to a range from 500° C. to 600° C.

A representative vacuum transfer device having a link mechanism uses a magnetic fluid or a seal ring for a vacuum seal. There are also mechanical parts such as a power transmission mechanism including a drive and gears/belts, but these mechanical parts do not have heat resistance either. For this reason, when the substrate holder takes out a high-temperature substrate, the vacuum transfer device becomes a high temperature and undergoes deterioration in vacuum sealing performance thereof, which causes a risk of resulting in a deterioration in film quality due to the mixing of impurities. Further, there is also a risk of failures of the mechanical parts or deterioration in transfer precision by, for example, the thermal expansion of part members. Accordingly, a need exists to avoid the influence of heat by such a high-temperature wafer. Japanese Patent Laid-Open Publication No. 2001-035902 discloses a cooling structure in which a cooling block which circulates a coolant is affixed to an arm of a vacuum transfer device (robot) which transfers a wafer to cool the arm.

SUMMARY

A vacuum transfer device according to one aspect of the present disclosure is a vacuum transfer device that transfers a high-temperature substrate in a vacuum, and includes a main body including an arm unit with a mechanical part therein and a vacuum seal, a substrate holder connected to the main body to hold the substrate, a heat transport member provided on a surface of the main body, made of a material having a higher thermal conductivity in a creeping direction than that of a material constituting the main body, and configured to transport heat transferred from the substrate to the substrate holder, and a heat dissipater configured to dissipate heat transported by the heat transport member.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawings, which form a part hereof. The illustrative embodiments described in the detailed description, drawing, and claims are not meant to be limiting. Other embodiments may be utilized, and other changes may be made without departing from the spirit or scope of the subject matter presented here.

Hereinafter, an embodiment will be described with reference to the accompanying drawings.

<Substrate Processing System>

Figure 1:
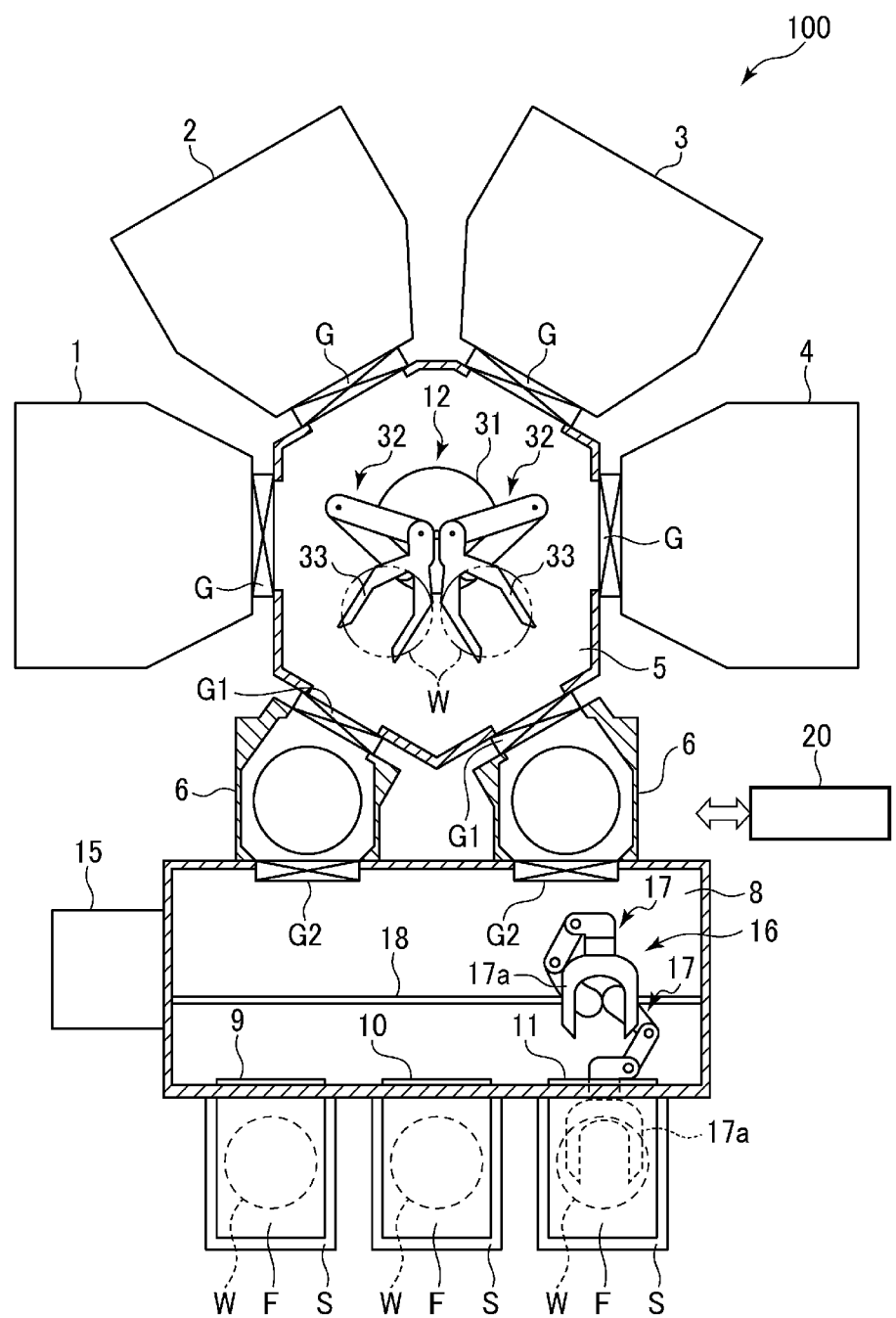
FIG. 1 is a schematic diagram illustrating an example of a substrate processing system in which a vacuum transfer device according to an embodiment is used.

FIG. 1 is a schematic diagram illustrating an example of a substrate processing system in which a vacuum transfer device according to an embodiment is used.

The substrate processing system 100 continuously performs a high-temperature processing, for example, a film forming processing such as CVD, ALD, or PVD, on a plurality of substrates. Although the substrate is not specifically limited, a case where a semiconductor wafer (wafer) is used as the substrate will be described by way of example in the following description.

As illustrated in FIG. 1, the substrate processing system 100 includes four processing apparatuses 1, 2, 3 and 4, and these processing apparatuses 1 to 4 are provided to correspond respectively to wall portions corresponding to four sides of a vacuum transfer chamber 5 having a hexagonal planar shape. The inside of the vacuum transfer chamber 5 is configured to be evacuated by a vacuum pump (not illustrated) and be maintained at a predetermined degree of vacuum. In the processing apparatuses 1 to 4, a high-temperature processing in a vacuum for a wafer W, for example, a film forming processing of forming a thin film at a high temperature on the wafer W is performed in practice. Examples of the film forming processing include CVD, ALD, and PVD.

Further, two load lock chambers 6 are connected to the other wall portions of the vacuum transfer chamber 5. An atmospheric transfer chamber 8 is connected to the side of the two load lock chambers 6 opposite to the vacuum transfer chamber 5. The load lock chambers 6 control the pressure between the atmospheric pressure and the vacuum when the wafer W is transferred between the atmospheric transfer chamber 8 and the vacuum transfer chamber 5. The number of load lock chambers 6 may be one, or may be three or more.

The vacuum transfer chamber 5 includes therein a vacuum transfer device 12 to carry the wafer W to and from the processing apparatuses 1 to 4 and the load lock chambers 6. The vacuum transfer device 12 includes a base 31 arranged substantially at the center of the vacuum transfer chamber 5, two articulated arm units 32 each having a base end attached to the base 31, and two wafer holders 33 which hold the wafer W. The details of the vacuum transfer device 12 will be described later.

Three ports 9, 10 and 11 for attachment of FOUPs which are containers for accommodating the wafer W therein are provided in the side of the atmospheric transfer chamber 8 opposite to the load lock chambers 6. A filter (not illustrated) is provided on the top of the atmospheric transfer chamber 8 to form a downflow of clean air.

As illustrated in this drawing, each of the processing apparatuses 1 to 4 is connected to the wall portion corresponding to each wall portion of the vacuum transfer chamber 5 via a gate valve G, and communicates with the vacuum transfer chamber 5 by opening the corresponding gate valve G and is blocked from the vacuum transfer chamber 5 by closing the corresponding gate valve G. Further, the two load lock chambers 6 are connected to the respective remaining wall portions of the vacuum transfer chamber 5 via a first gate valve G1, and are further connected to the atmospheric transfer chamber 8 via a second gate valve G2.

Each of the ports 9, 10, and 11 which are wafer storage containers of the atmospheric transfer chamber 8 is provided with a shutter (not illustrated), and the FOUP F which accommodates the wafer W therein or is empty is directly attached to a stage S at the port 9, 10 or 11. When attached, the shutter is removed so that the FOUP communicates with the atmospheric transfer chamber 8 while preventing the intrusion of outside air. Further, an alignment chamber 15 is provided on the lateral side of the atmospheric transfer chamber 8 and thus, alignment of the wafer W is performed.

The atmospheric transfer chamber 8 includes therein an atmospheric transfer device 16 to perform the carry-in/out of the wafer W to and from the FOUP F and the carry-in/out of the wafer W to and from the load lock chamber 6. The atmospheric transfer device 16 has two articulated arms 17, and the two articulated arms 17 are able to travel on a rail 18 along the arrangement direction of the FOUPs F and thus, perform the transfer of the wafer W in a state of supporting the wafer W on a hand 17a at the tip thereof.

Further, the substrate processing system 100 includes a control device 20 which controls a process.

In such a substrate processing system 100, first, the wafer W is taken out from the FOUP F connected to the atmospheric transfer chamber 8 by the articulated arm 17 of the atmospheric transfer device 16, and is carried into the load lock chamber 6 under the atmospheric atmosphere. Then, after the load lock chamber 6 into which the wafer W has been carried is brought into a vacuum state corresponding to the vacuum transfer chamber 5, the wafer W therein is carried into any one of the processing apparatuses by any one of the holders 33 of the vacuum transfer device 12. In the processing apparatus into which the wafer W has been carried, a high-temperature processing such as a film forming processing is performed.

After the high-temperature processing in the processing apparatus is terminated, any one of the wafer holders 33 of the vacuum transfer device 12 takes out the wafer W which has reached a high temperature, for example, within a range from 200° C. to 600° C. by the processing in the processing apparatus, and transfers the wafer W to the load lock chamber 6. Then, after the load lock chamber 6 into which the wafer W has been carried is brought into the atmospheric atmosphere, the wafer W is taken out from the load lock chamber by the support arm 17 of the atmospheric transfer device 16, and is stored in the FOUP F.

The above-described processing is performed simultaneously and in parallel on a plurality of wafers W, so that all wafers W in the FOUP F are subjected to the processing.

<Vacuum Transfer Device>

Next, the vacuum transfer device according to an embodiment will be described.

Figure 2:
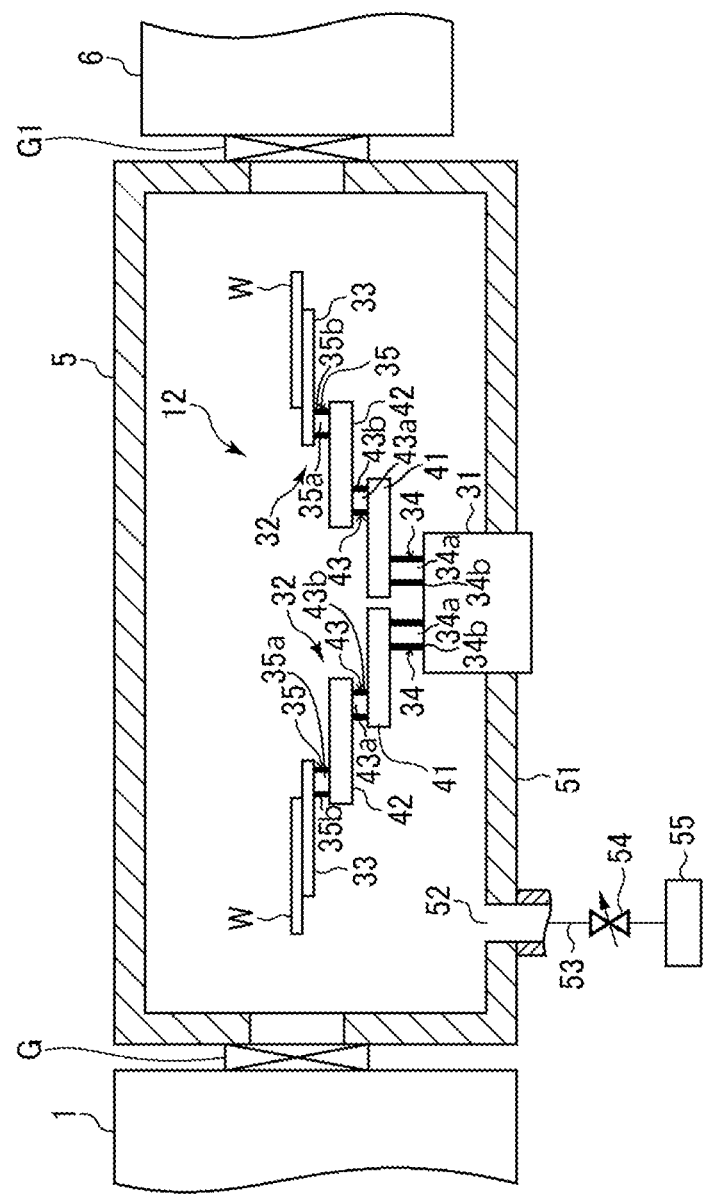
FIG. 2 is a cross-sectional view illustrating a schematic configuration of the vacuum transfer device according to an embodiment which is mounted in the substrate processing system of FIG. 1.
Figure 3:
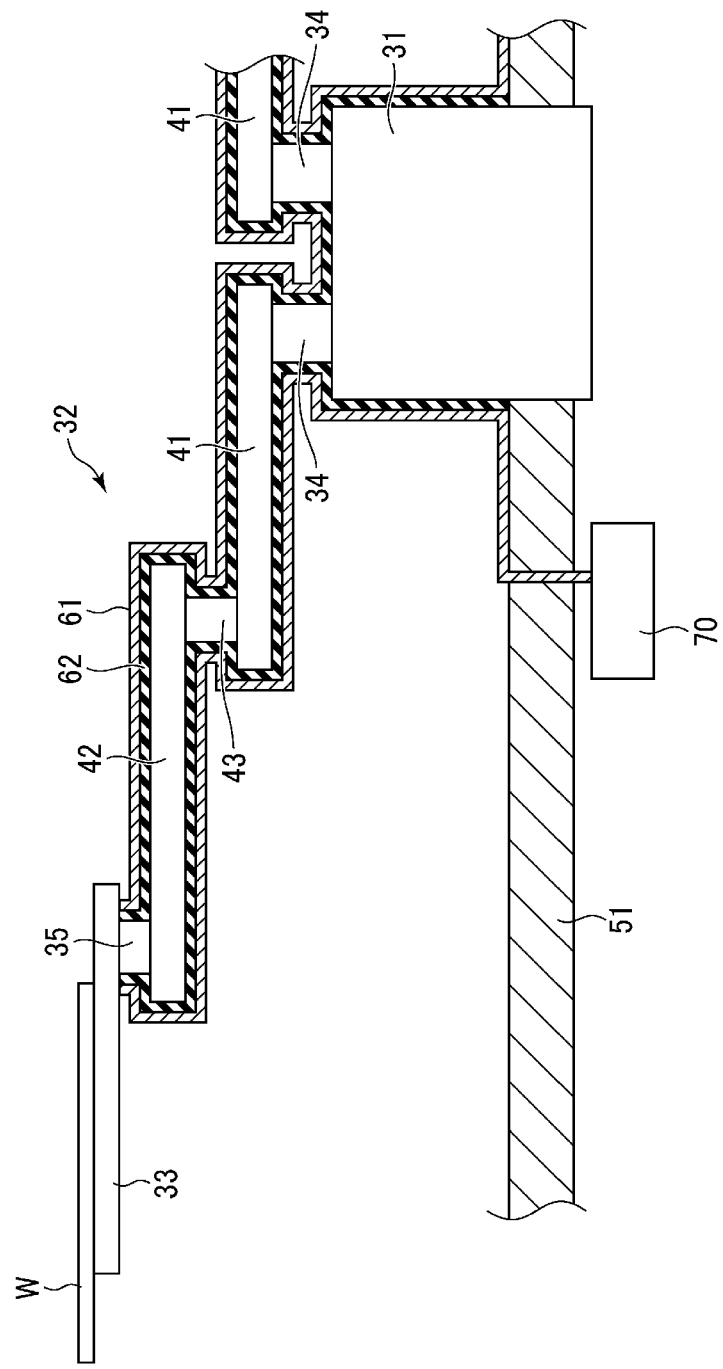
FIG. 3 is a cross-sectional view illustrating the vacuum transfer device of FIG. 2 in more detail.

FIG. 2 is a cross-sectional view illustrating a schematic configuration of the vacuum transfer chamber 5 and the vacuum transfer device 12 provided therein, and FIG. 3 is a cross-sectional view illustrating the vacuum transfer device 12 in more detail.

An exhaust port 52 is provided in the vacuum transfer chamber 5, and an exhaust pipe 53 is connected to the exhaust port 52. A pressure control valve 54 and a vacuum pump 55 are connected to the exhaust pipe 53, and the inside of the vacuum transfer chamber 5 is adjusted to a predetermined degree of vacuum.

As described above, the vacuum transfer device 12 provided in the vacuum transfer chamber 5 includes the base 31 arranged substantially at the center of the vacuum transfer chamber 5, the two articulated arm units 32 each having a base end attached to the base 31, and the two wafer holders 33 which hold the wafer W. Since the two articulated arm units 32 and the two substrate holders 33 have the same structure, respectively, only one is mainly illustrated in FIG. 3.

The base 31 is provided on the bottom of the transfer chamber 5, has a hollow structure the inside of which is at the atmospheric pressure, and is provided therein with a drive. The articulated arm unit 32 includes a first arm 41 and a second arm 42. The base end of the first arm 41 is pivotably connected to the upper surface of the base 31 by a connector 34 which includes a shaft 34a extending from the upper surface of the base 31 and a vacuum seal 34b. Further, the base end of the second arm 42 is pivotably connected to the tip end of the first arm 41 by a connector 43 which includes a shaft 43a and a vacuum seal 43b. The wafer holder 33 serves to hold the wafer W, and the base end thereof is pivotably connected to the tip end of the second arm 42 by a connector 35 which includes a shaft 35a and a vacuum seal 35b. The parts of the vacuum transfer device 12 other than the wafer holder 33 constitute a main body.

The first arm 41 and the second arm 42 have a hollow structure the inside of which is at the atmospheric pressure, and are provided therein with a power transmission mechanism. Thus, the power transmission mechanism transmits the drive force of the drive to the first arm 41, the second arm 42, and the wafer holder 33, and they are configured to freely pivot via the connectors 34, 43 and 35 to perform a desired wafer transfer operation. That is, the vacuum transfer device 12 realizes an articulated structure by a general link mechanism, and is operated by mechanical parts including the drive and the power transmission mechanism.

The parts other than a case of the base 31, the articulated arm unit 32, and the seals of the connectors 34, 35 and 43 which are major parts of the main body are made of a metal such as aluminum. The wafer holder 33 is made of a material having heat resistance against the temperature of the wafer W. The wafer holder 33 may use general aluminum if the temperature of the wafer W is 200° C. or less, but may use a material having high heat resistance, for example, alumina when the temperature of the wafer W exceeds 200° C. The wafer holder 33 may be made of the same material as a heat transport member 61 to be described later.

As illustrated in FIG. 3, the main body of the vacuum transfer device, i.e., the base 31, the first arm 41 and the second arm 42 of the articulated arm unit 32, and the connectors 34, 35 and 43 are provided on the surface thereof with the heat transport member 61 via a heat insulating member 62. The heat transport member 61 is made of a material having a higher thermal conductivity in the creeping direction than a material constituting the may body. The heat transport member 61 extends from the case of the base 31 further inside a bottom wall 51 of the vacuum transfer chamber 5 in a direction away from the base 31, and extends downward of the vacuum transfer chamber 5 in the middle thereof to reach a heat dissipater 70 provided outside the vacuum transfer chamber 5. Although the heat transport member 61 is drawn as an integral member in FIG. 3, in the connectors 34, 43 and 35, the heat transport member 61 is separated while remaining in contact with the heat transport member 61 so as to allow the wafer holder 33, the first arm 41, and the second arm 42 to be pivotable. Further, the heat transport member 61 may not be provided on the connector 35.

Thus, after heat from the high-temperature wafer W is transferred to the wafer holder 33, the heat is transported to the heat dissipater 70 by the heat transport member 61 provided on the surface of the main body, thereby dissipating from the heat dissipater 70. The heat dissipater 70 is not specifically limited, and may be a heat sink such as a fin, or may be anyone having a cooling function. Further, the heat transport member 61 may be simply exposed to the outside of the vacuum transfer chamber 5, and an exposed portion thereof may be used as a heat dissipater.

The heat transport member 61 may use a material having a higher thermal conductivity in the creeping direction than a material constituting the main body including the case of the base 31 and the first arm 41 and the second arm 42 of the articulated arm unit 32. For example, when the main body is made of aluminum, the material of the heat transport member 61 may be copper, AlN, or graphite. The thermal conductivity of aluminum is about 200 W/m·K, whereas the thermal conductivity of copper ranges from 370 W/m·K to 400 W/m·K and the thermal conductivity of AlN is 250 W/m·K. Further, graphite has anisotropy in thermal conductivity, and the thermal conductivity thereof is 100 W/m·K in the thickness direction, but is a very large value of 2,000 W/m·K in the creeping direction, which is about 10 times that of aluminum. For this reason, it exhibits a very great heat transport ability while suppressing heat transfer to the main body such as the base 31 or the articulated arm unit 32. The heat transport member 61 may be provided on the surface of the wafer holder 33.

The heat insulating member 62 may be made of a material having a low thermal conductivity such as a resin, and may have a porous body. Further, a gap may be provided between the main body and the heat transport member 61 to realize vacuum insulation.

When heat is allowed to be applied from the heat transport member 61 to the vacuum seal or the mechanical part, the heat transport member 61 may be provided directly on the main body without providing the heat insulating material 62 or the gap between the main body and the heat transport member 61.

In the present embodiment, the substrate is subjected to a high temperature processing, for example, a high temperature film forming processing such as CVD, ALD, or PVD. The temperature of the wafer W when the wafer W is taken out from the processing apparatus by the wafer holder 33 of the vacuum transfer device 12 is, for example, a high temperature ranging from 200° C. to 600° C.

In this case, since the vacuum seal present in the connectors 34, 43 and 35 includes a magnetic fluid or a seal ring and has no heat resistance, the vacuum transfer device 12 is deteriorated in vacuum sealing performance when heat is transferred from the wafer W, which has a risk of resulting in deterioration in film quality due to the mixing of impurities. Further, since the mechanical part such as the drive or the power transmission mechanism also has no heat resistance, it has a risk of malfunction or deterioration in transfer accuracy when heat is transferred from the wafer W. In order to avoid the influence of heat, as in Japanese Patent Laid-Open Publication No. 2001-035902, when a cooling mechanism is provided to circulate a coolant, the structure of the vacuum transfer device is complicated, which increases the size of the device and also increases the cost.

Meanwhile, in the vacuum transfer device 12 according to the present embodiment, the heat of the high-temperature wafer W held by the wafer holder 33 is transferred and transported by the heat transport member 61 made of a material having a higher thermal conductivity in the creeping direction than that of a material constituting the articulated arm unit 32 so as to dissipate. Specifically, the heat transport member 61 is provided along the surfaces of the connector 35, the second arm 42, the connector 43, the first arm 41, the connector 34, and the case of the base 31, so that the heat transferred from the wafer W to the wafer holder 33 is transferred to the heat transport member 61 to be transported in the creeping direction thereof. Then, the heat transferred and transported by the heat transport member 61 in the creeping direction dissipates to the heat dissipater 70 provided outside the vacuum transfer chamber 5. Accordingly, the heat applied to the vacuum seal or the mechanical part may be suppressed with a simple structure without using a large-scale configuration like a cooling mechanism.

Further, by providing the heat insulating member 62 between the main body including the base 31, the articulated arm unit 32 or the connectors 34, 43 and 35 and the heat transport member 61, the heat applied from the heat transport member 61 to the vacuum seal or the mechanical part may be more effectively suppressed. Further, the same effect may be obtained by providing a gap between the main body and the heat transport member 61 for vacuum insulation.

As described above, a material having a higher thermal conductivity in the creeping direction than a material constituting the main body is used as a material constituting the heat transport member 61, but graphite may be particularly suitably used. Graphite has anisotropy in thermal conductivity, and the thermal conductivity thereof is 100 W/m·K in the thickness direction, but is a very large value of 2,000 W/m·K in the creeping direction, which is about 10 times that of aluminum. Accordingly, it may exhibit a very great heat transport ability in the creeping direction while suppressing heat transfer to the main body such as the base 31 or the articulated arm unit 32, thus achieving a very high effect of suppressing the influence of heat on the vacuum seal or and the mechanical part.

<Other Applications>

For example, the embodiment has described a vacuum transfer device including a base, an articulated arm unit, and a wafer holder, but the present disclosure is not limited to this structure, and may have other structures as long as they include a main body having a vacuum seal and a mechanical part and a wafer holder.

Further, although a case where a semiconductor wafer is used as a substrate has been described, the present disclosure is not limited to the semiconductor wafer, and may employ other substrates such as a flat panel display (FPD) substrate or a ceramic substrate.

According to the present disclosure, there are provided a vacuum transfer device and a substrate processing system which may suppress the influence of heat from a high-temperature substrate to a vacuum seal or a mechanical part with a simple structure.

From the foregoing, it will be appreciated that various exemplary embodiments of the present disclosure have been described herein for purposes of illustration, and that various modifications may be made without departing from the scope and spirit of the present disclosure. Accordingly, the various exemplary embodiments disclosed herein are not intended to be limiting, with the true scope and spirit being indicated by the following claims.

What is claimed is:

1. A vacuum transfer device comprising:
   a main body including an arm with an internal mechanical part therein and a vacuum seal, and configured to transfer a high-temperature substrate in a vacuum;
   a substrate holder connected to the main body to hold the substrate;
   a heat transport plate provided on a surface of the main body, made of a material having a higher thermal conductivity than that of a material constituting the main body in a creeping direction, and configured to transport heat transferred from the substrate to the substrate holder; and
   a heat radiator connected to the heat transport plate and configured to dissipate heat transported from the heat transport plate,
   wherein the vacuum transfer device is provided inside a vacuum transfer chamber maintained in a vacuum, the heat radiator is provided outside the vacuum transfer chamber, and the heat transport plate extends to the outside of the vacuum transfer chamber.

2. The device according to claim 1, wherein the arm has an articulated structure including a first arm, a second arm, and a first connector connecting the first arm and the second arm to each other, and the vacuum seal is provided in the first connector.

3. The device according to claim 2, wherein the main body further includes a base having a drive as the internal mechanical part, the arm is connected to the base via a second connector, and the vacuum seal is provided in the second connector.

4. The device according to claim 3, wherein the main body further includes a third connector connecting the arm and the substrate holder to each other, and the vacuum seal is provided in the third connector.

5. The device according to claim 4, wherein the heat transport plate is made of graphite.

6. The device according to claim 5, further comprising:
   an insulating plate provided between the main body and the heat transport plate.

7. The device according to claim 5, wherein a gap is provided between the main body and the heat transport plate maintaining a vacuum state therebetween, and the main body and the heat transport plate are heat-insulated by the gap.

8. The device according to claim 7, wherein the substrate has a temperature of 200° C. to 600° C.

9. The device according to claim 1, wherein the main body further includes a base having a drive as the internal mechanical part, the arm is connected to the base via a second connector, and the vacuum seal is provided in the second connector.

10. The device according to claim 9, wherein the heat transport plate extends from the base further inside a bottom wall of the vacuum transfer chamber in a direction away from the base, and extends downward of the vacuum transfer chamber in a middle thereof to reach the heat radiator.

11. The device according to claim 1, wherein the main body further includes a third connector connecting the arm and the substrate holder to each other, and the vacuum seal is provided in the third connector.

12. The device according to claim 1, wherein the heat transport plate is made of graphite.

13. The device according to claim 1, further comprising:
    an insulating plate provided between the main body and the heat transport plate.

14. The device according to claim 1, wherein a gap is provided between the main body and the heat transport plate maintaining a vacuum state therebetween, and the main body and the heat transport plate are heat-insulated by the gap.

15. The device according to claim 1, wherein the substrate has a temperature of 200° C. to 600° C.

16. A substrate processing system comprising:
    a processing apparatus configured to perform a high-temperature processing on a substrate in a vacuum;
    a vacuum transfer chamber provided adjacent to the processing apparatus and maintained in a vacuum; and
    the substrate transfer device according to claim 1 provided inside the vacuum transfer chamber and configured to carry the substrate into and from the processing apparatus.

* * * * *